United States Patent
Kintis et al.

(10) Patent No.: US 9,425,840 B2
(45) Date of Patent: Aug. 23, 2016

(54) WIDEBAND TUNABLE NOTCH CANCELLATION

(71) Applicant: Northrop Grumman Systems Corporation, Falls Church, VA (US)

(72) Inventors: Mark Kintis, Manhattan Beach, CA (US); Xing Lan, Huntington Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 309 days.

(21) Appl. No.: 13/871,544

(22) Filed: Apr. 26, 2013

(65) Prior Publication Data

US 2014/0323076 A1    Oct. 30, 2014

(51) Int. Cl.
*H04B 1/10* (2006.01)
*H03H 7/01* (2006.01)

(52) U.S. Cl.
CPC .......... *H04B 1/1036* (2013.01); *H03H 7/0123* (2013.01); *H03H 2007/013* (2013.01)

(58) Field of Classification Search
CPC .......... H04B 2001/1063; H04B 15/00; H04B 1/1036
See application file for complete search history.

(56) References Cited

U.S. PATENT DOCUMENTS

| | | | |
|---|---|---|---|
| 3,633,117 A | 1/1972 | Reilly | |
| 4,731,587 A | 3/1988 | Jensen | |
| 6,539,202 B1 * | 3/2003 | Yamashita et al. | 455/24 |
| 6,807,405 B1 * | 10/2004 | Jagger et al. | 455/296 |
| 7,031,402 B2 * | 4/2006 | Takada | 375/296 |
| 7,194,050 B2 | 3/2007 | Nicholls et al. | |
| 7,317,698 B2 | 1/2008 | Jagger et al. | |
| 7,738,610 B2 | 6/2010 | Chan et al. | |
| 7,750,734 B2 | 7/2010 | Bretchko et al. | |
| 7,899,142 B2 | 3/2011 | Hayashi et al. | |
| 8,345,808 B2 * | 1/2013 | Ye et al. | 375/348 |
| 2002/0071508 A1 * | 6/2002 | Takada et al. | 375/346 |
| 2002/0153971 A1 * | 10/2002 | Hershtig | 333/202 |
| 2002/0153972 A1 * | 10/2002 | Hershtig | 333/202 |

(Continued)

FOREIGN PATENT DOCUMENTS

| | | |
|---|---|---|
| EP | 1009100 | 6/2000 |
| WO | 2005/031999 | 4/2005 |

OTHER PUBLICATIONS

Robertson, I.D. et al; Novel Techniques for Multi-Octave GaAs MMIC Receivers; IEE Colloquium on Multi-Octave Active and Passive Components and Antennas; pp. 2/1-2/5, May 10, 1989.

Zhang, Xinying et al; Variable-Phase-Shift-Based RF-Baseband Codesign for MIMO Antenna Selection; IEEE Transactions on Signal Processing; vol. 53, No. 11; pp. 4091-4103; Nov. 2005.

Nishio, Takahide et al; A Frequency-Controlled Beam-Steering Array With Mixing Frequency Compensation for Multichannel Applications; IEEE Transactions on Antennas and Propagation; vol. 52, No. 4; pp. 1039-1048; Apr. 2004.

(Continued)

*Primary Examiner* — Bobbak Safaipour
*Assistant Examiner* — Devan Sandiford
(74) *Attorney, Agent, or Firm* — Patti & Malvone Law Group, LLC

(57) ABSTRACT

A system and method for wideband tunable notch cancellation that is passive and does not require feedback or feed forward circuitry. An input spectrum containing interference is split into two signals that are 180 degrees out of phase with each other. The preferred signal is filtered out of the 180 degree out of phase signal using a notch filter while the original signal is sent through a delay line. Then the two signals are summed with a power summer so that the interference signals that are 180 degrees out of phase with those in the original signal are cancelled out and the preferred signal remains. The notch filter is tunable to different preferred signals.

18 Claims, 2 Drawing Sheets

(56) References Cited

U.S. PATENT DOCUMENTS

| | | | |
|---|---|---|---|
| 2002/0155812 A1* | 10/2002 | Takada | 455/63 |
| 2003/0169128 A1* | 9/2003 | Rauscher | 333/175 |
| 2005/0070232 A1* | 3/2005 | Mages | 455/78 |
| 2005/0200422 A1* | 9/2005 | Shamsaifar et al. | 333/17.1 |
| 2006/0009172 A1* | 1/2006 | Shamsaifar | 455/114.2 |
| 2006/0019611 A1* | 1/2006 | Mages | 455/73 |
| 2006/0273869 A1* | 12/2006 | Jachowski | 333/204 |
| 2007/0082638 A1* | 4/2007 | Panfilov et al. | 455/224 |
| 2009/0231058 A1* | 9/2009 | Nishino et al. | 333/118 |
| 2011/0065408 A1* | 3/2011 | Kenington et al. | 455/303 |
| 2011/0227665 A1* | 9/2011 | Wyville | 333/17.1 |
| 2011/0305306 A1* | 12/2011 | Hu et al. | 375/350 |
| 2012/0161904 A1* | 6/2012 | Do et al. | 333/202 |
| 2012/0171978 A1* | 7/2012 | Sharma et al. | 455/230 |
| 2012/0212304 A1* | 8/2012 | Zhang et al. | 333/174 |
| 2013/0147535 A1* | 6/2013 | Hur et al. | 327/231 |

OTHER PUBLICATIONS

Kawakami, Kenji Eet Al; Millimeter-Wave Low Spurious Quadruple Harmonic Image Rejection Mixer with 90-degree LO Power Divider; Proceedings of the 3rd Microwave Integrated Circuits Conference 2008; EuMIC 2008; pp. 414-417; Oct. 27-28, 2008; Amsterdam, The Netherlands.

Lee, Fred S. et al; A BiCMOS Ultra-Wideband 3.1-10.6-GHz Front-End; IEEE Journal of Solid-State Circuits; vol. 41, No. 8; pp. 1784-1791; IEEE Aug. 2006.

Townsend, Kenneth A. et al; Ultra-Wideband Front-End With Tunable Notch Filter; 2006 IEEE North-East Workshop on Circuits and Systems; pp. 177-180, Jun. 18-21, 2006.

Wang, Yue et al; Active Interference Cancellation for Systems with Antenna Selection; Communications, 2008. ICC '08. IEEE International Conference on, pp. 3785-3789, May 19-23, 2008.

* cited by examiner

WIDEBAND TUNABLE NOTCH CANCELLATION

TECHNICAL FIELD

The present invention relates generally to radio frequency receiver systems. More particularly, the invention relates to a receiver that removes interference from a preferred signal without requiring complex feedback or mixing circuitry.

BACKGROUND

In commercial communication systems, radio frequency interference (RFI) is a well-known phenomenon, particularly in urban areas where wireless coverage is everywhere. Most radio frequencies (RF) fall into the electromagnetic spectrum, ranging from above audio to infrared bands.

In brief, interference comes from an outside source that is external to the preferred signal path and generates unwanted artifacts in the preferred signal. One common source is co-channel interference (CCI) which occurs when two different radio transmitters use the same frequency. In a cellular network, for example, adjacent base stations are assigned to different frequencies. Since there are a finite number of frequencies available, receivers may occasionally be in range of two different base stations using the same frequency, leading to deterioration in receiver performance. A similar problem can happen with radio and television stations, or any system transmitting radio frequencies. In this case, the interference is referred to as RFI (radio-frequency interference).

Another source of interference is adjacent channel interference (ACI). This occurs when extraneous power from an adjacent channel, or frequency, is detected by a receiver. The extraneous power emitted by a transmitter is typically called adjacent-channel leakage and is a function of radio frequency (RF) filters.

A third source of interference is co-site interference. This results from an imperfect receiver that allows nearby frequency signals to leak into its pass band. This type of interference is especially challenging in situations where an adjacent channel is transmitting in close range to a receiver that is trying to receive a weak signal.

It is difficult to avoid RFIs. Possible sources include intentional transmissions, such as those from radio and TV stations or cell phones, as well as unintended radiation from such sources as power lines, appliances and other wireless devices.

Typically, receivers are designed with various filters to improve their ability to pick up only the preferred signal, however integration of a number of standards and frequency bands in transceiver systems impose tough challenges on the receiver design. The receiver chain can be desensitized by large sources of interference, or signal blockers, in a tough signal interference environment. This requires that receivers implement a blocking functionality to remove the RFI with maximum interference power at certain frequency offsets. The blocking function also has to have the flexibility to counter blockers at different frequencies. One traditional way to do this is to employ external passive surface-acoustic wave (SAW) filters to attenuate these blockers to a level that can be handled by the receiver chain. However, practically speaking, this is nearly impossible for integrated multi-mode, multi-standard transceivers since the SAW device not only consumes large amount of printed circuit board (PCB) area thus increasing the handset size, but it also increases the cost. In addition, it complicates the integration and manufacturability of the transceiver front-end.

Another kind of filter used in receivers is a notch filter. This is a band-stop filter with a narrow stopband that is used to cancel portions of a received signal in the stopband. Most current notch cancellation techniques are built, for example, upon feedback or feed-forward (FF) notch cancellation schemes, which are usually narrowband, and difficult to work with, with limited notch cancellation performances. Some wideband notch cancellation employ nonlinear transmission lines (NLTL) as tuning elements. However, these encounter additional spurious response and linearity problems.

Prior art feed forward (FF) interference cancellation techniques experience a number of issues including, for example, the fact that they are difficult to perform at higher microwave/mm-wave frequencies and they are used for single signal cancellation only. Since most FF interference cancellation techniques are aimed at reducing inter-modulation products (IMs), they use one or multiple control loops to reject blockers and loop selectivity depends on open loop gain, not on gain match of two paths.

Therefore, an interference cancellation scheme is needed that addresses with prior art devices using FF and I/Q mixers, for example, asymmetric closed loop transfer function, I/Q gain phase mismatch, and filter core excess noise.

SUMMARY

The above and other objectives are provided by a system and method for wideband tunable notch cancellation that is passive and does not require conventional feedback or feed forward circuitry. An input spectrum containing interference is split into two signals that are 180 degrees out of phase with each other. The preferred signal is filtered out of one signal which is then summed back with the original signal so that the interference signals that are 180 degrees out of phase cancel each other out.

In one embodiment, a radio frequency receiver is disclosed that includes a splitter for receiving an input signal comprising a preferred portion of a input frequency spectrum and an interference portion of the input frequency spectrum, a delay line for receiving a first output from the splitter, a tunable notch filter for receiving a second output from the splitter, the second output having a 180 degree difference in phase from the first output from the splitter, said tunable notch filter filtering out the preferred portion of the input frequency spectrum and outputting only the interference portion and a summer for combining the output of the tunable notch filter and the delay line such that the interference portion of the input frequency spectrum is cancelled out in the output signal of the summer.

In another embodiment, the notch filter of the radio frequency receiver includes a first wideband hybrid coupler with an input coupled to the first output of the splitter, a second wideband hybrid coupler with an output coupled to the summer and first and second band stop filters coupled to outputs of the first wideband hybrid coupler and the inputs of the second wideband hybrid coupler.

In any of the above embodiments, the band stop filters further include varactors for tuning the notch filter to filter out the preferred portion of the input frequency spectrum and bias voltage elements for changing an equivalent capacitance value of the varactor such that the center operation frequency of the notch filter is set.

In any of the above embodiments, the wideband hybrid couplers further include Lange couplers and an input impedance coupled to an input of the first wideband hybrid coupler and an absorptive load at the output of the second wideband hybrid coupler, wherein the input impedance and the absorptive load are 50 Ohms.

In a further embodiment, a method for performing notch cancellation on a wideband signal is disclosed, the method including the steps of splitting the wideband signal comprising a preferred portion of a frequency spectrum and an interference portion of the frequency spectrum into signals that are 180 degrees out of phase, receiving a first output from the power splitter at a delay line, receiving a second output from the power splitter at a tunable notch filter, the second output having a 180 degree difference in phase from the first output, said tunable notch filter filtering out the preferred portion of the input frequency spectrum and outputting only the interference portion and combining the output of the tunable notch filter and the delay line such using a power summer so that the interference portion of the frequency spectrum is cancelled out in the output signal of the power summer.

BRIEF DESCRIPTION OF THE DRAWINGS

The accompanying drawings provide visual representations which will be used to more fully describe various representative embodiments and can be used by those skilled in the art to better understand the representative embodiments disclosed herein and their inherent advantages. In these drawings, like reference numerals identify corresponding elements.

DETAILED DESCRIPTION

Figure 1:
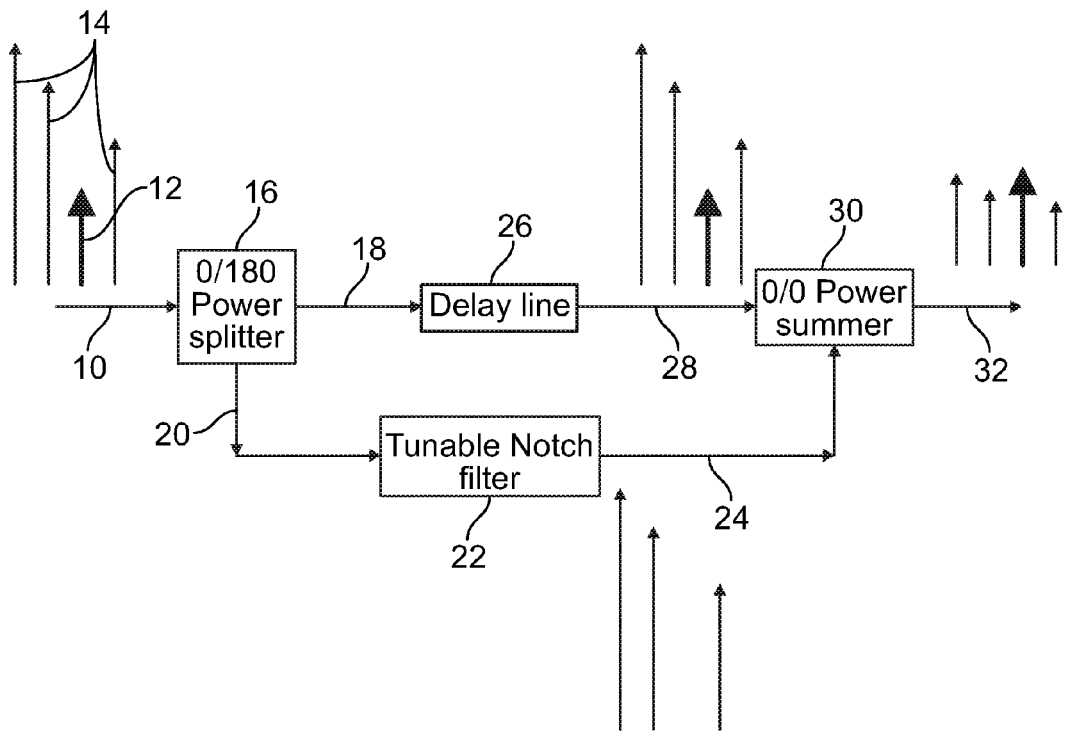
FIG. 1 is a block diagram of a tunable notch filter radio canceller with vector interference cancellation.

As shown in the drawings for purposes of illustration and as described below, novel techniques are disclosed for notch cancellation using vector interference cancellation.

A receiver according to an embodiment of the invention is shown in FIG. 1. An input spectrum received on line 10 contains both a preferred signal 12 and interference signals 14. A 0/180 power splitter 16 splits input spectrum 10 into two lines, 18 and 20. In an embodiment, power splitter 16 can be implemented using a Marchand Balun divider followed by a 180 degree phase shifter in one of its output paths. On line 18, the spectrum is in phase with the input spectrum on line 10, while on line 20, the input spectrum in 180 degrees out of phase with the input spectrum on line 10. Line 20 is input to tunable notch filter 22, which rejects the preferred signal 12 from the input spectrum on line 10, so that only undesired interference is left in spectrum at the output of tunable notch filter 22 on line 24. Line 18, output from power splitter 16, is input to delay line 26. Delay line 26 is set to have the same amount of time delay as the delay from the tunable notch filter 22. This allows maximum cancellation of the interference signals. Delay line 26 outputs the in phase input spectrum from line 18 onto line 28.

The input spectrum on line 28 and the 180 degree out of phase interference spectrum on line 24 are then input to 0/0 power summer 30, which is an in-phase power combiner. In an embodiment, power summer 30 can be implemented as a Wilkinson divider. Due to the 180 degree phase difference generated at the input power splitter, the interference signal from the two spectrums cancel out, and only the preferred signal is preserved at the output of power summer 30 on line 32. In the ideal case, there will be no interference signals remaining on line 32. However, in reality, the cancellation is not perfect, so there will be some residue left for the interference signal as shown in FIG. 1. To achieve a maximum degree of cancellation, both signal phase and amplitude of the two paths need to track. If, at the output summer, the phases of the signals on lines 24 and 28 are truly 180 degrees out of phase with each other, and the amplitudes are exactly the same, then summing will completely wipe out the interference signals. If they are not 180 degree out of phase, or the amplitude is not the same, the interference signals will not completely cancel. Adjusting the phase and amplitude of a signal could be done, for example, by inserting a compensating variable phase shifter and attenuator to one of the paths. One of ordinary skill in the art would understand how to insert these elements in the circuitry of FIG. 1 so as to provide optimum interference signal cancellation. Most commonly, they would be inserted in the path with the delay line, line 28, but they could also be inserted in line 24.

Figure 2:
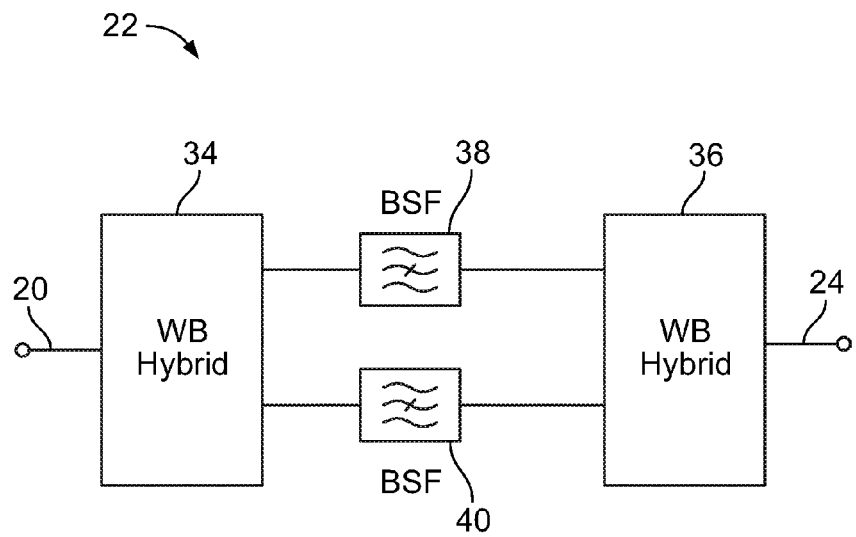
FIG. 2 is a block diagram of a top level configuration of a balanced tunable notch filter of FIG. 1.

A more detailed diagram of tunable notch filter 22 is shown in FIG. 2. Notch filters are a type of filter generally known as a band-stop filter with a narrow stopband. This means the notch filter effectively takes a "notch" out of the input signal. Most notch filters have very poor return loss or impedance matching at the stopband, or notch band, with the result that a portion of the signal power received at the notch filter is reflected back to the source. The reflected signals at the notch band may degrade linearity of the overall system, due to re-mixing of bounced signals with other large signals in the chain. To preserve a good matching condition, an absorptive balanced mixer is used in this disclosure. As seen in FIG. 2, wideband 90 degree hybrid couplers 34 and 36 are used at the input and output ports of balanced notch filter elements 38 and 40. These hybrids can be implemented using broadside coupling design techniques, or multi-stage configuration to achieve preferred wide bandwidth operation. The notch filter cores in the upper path and lower path are identical. As shown in FIG. 2, the notch filter cores are band stop filters (BSF) 38 and 40. The provision of identical BSFs insures a balanced operation and high rejection level. In an embodiment, the notch filter core can be integrated with other active or passive IC components on semiconductor substrates, for example, Silicon (Si), Indium Phosphate (InP), or Gallium Arsenide (GaAs) substrates, etc. In addition, on-chip tunable varactor diodes can be integrated to make the notch filter tunable to suppress dynamically changing blocker signals.

Figure 3:
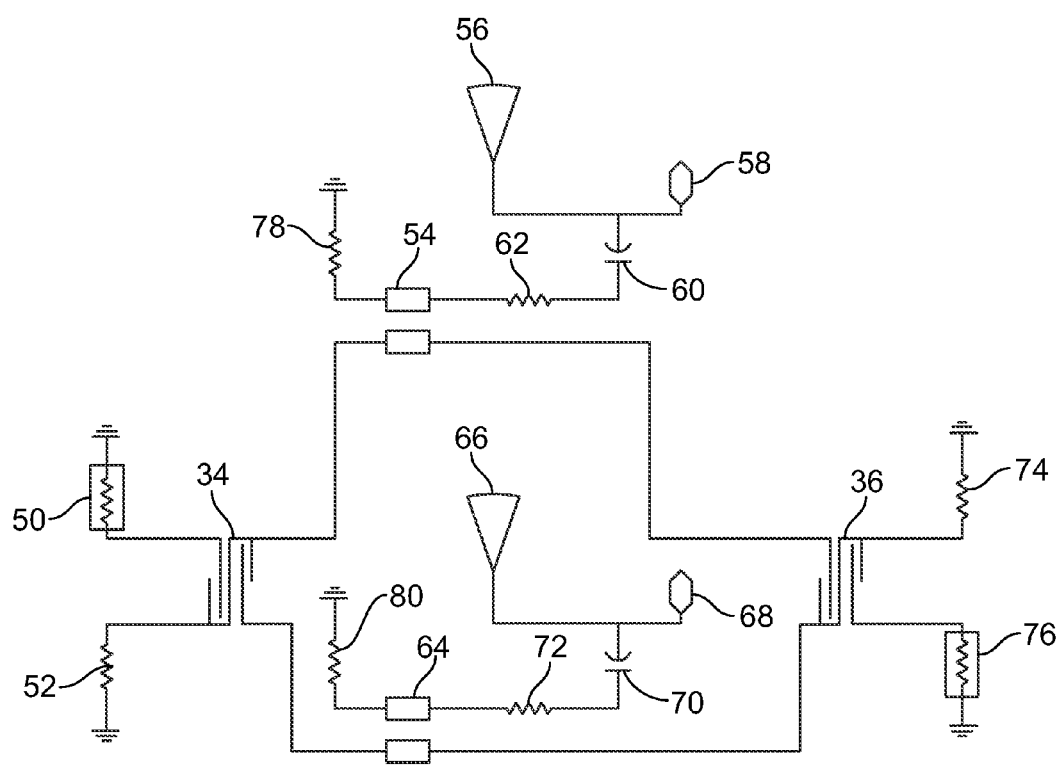
FIG. 3 is a more detailed diagram of the balanced tunable notch filter of FIG. 2.

A more detailed configuration of an embodiment of the notch filter of FIG. 2 is shown in FIG. 3. Wideband hybrid couplers 34 and 36 are, for example, Lange coupler types. This type of coupler offers a bandwidth ratio of approximately 2:1. Band stop filter 38 from FIG. 2 is includes coupling section 54, biasing fan stub 56, biasing voltage 58, variable capacitor 60, varactor equivalent series resistance 62 and resistor 78. Band stop filter 40 of FIG. 2 includes coupling section 64, biasing fan stub 66, biasing voltage 68, variable capacitor 70, varactor equivalent series resistance 72 and resistor 80. Although specific circuitry has been depicted in FIG. 3, one of ordinary skill would recognize that substitutions could be made for the components. For example, coupling sections 54 and 64, in an embodiment, are microstrip lines (MCLIN).

Wideband hybrid couplers 34 and 36, coupling sections 54 and 64, and varactors 60/62 and 70/72 are responsible for the wideband notch tuning. The varactors are represented as, for example, variable capacitors 60, 70 and varactor equivalent series resistance 62, 72 but any suitable circuitry for providing a variable capacitance could be used. The voltage for the varactors is provided by fan stubs 56, 66 and biasing voltages 58 and 68, respectively. The bias voltage 58 and 68 to varactors 60 and 70 respectively is injected thru the fan shape stubs 56 and 66, which serve as part of the RF biasing circuit. Changing the bias voltage tunes the varactor's equivalent capacitance value. Therefore, it changes the center operating frequency of the notch filter. The center operating frequency of the notch filter is set to select the preferred input signal.

Any wave generated from mismatch in the configuration in the lower path (band stop filter 40 of FIG. 2) and upper path (band stop filter 38 of FIG. 2) is absorbed in the resistive loads 52, 74 connected to the wideband couplers instead of being bounced around inside the lower and upper paths, and also to other external components outside the notch filter block. Resistive loads 52 and 74 are, for example, 50 Ohms but any suitable resistance could be used.

The simulation of the above tunable notch filter demonstrates excellent wideband impedance matching of better than 20 dB return loss at both inside and outside the band. Sharp notch instantaneous bandwidth of around 50 MHz is achieved. The notch rejection level is around 25 dB.

As shown in the drawings for purposes of illustration and as described below, novel techniques are disclosed for a RF receiver with wideband tunable notch cancellation. This disclosed approach can be applied to many satellite phase arrays, radar, and commercial communication systems, where tough signal interference or blocking exists.

The representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. A radio frequency receiver comprising:
    a splitter for receiving an input signal comprising a preferred portion of a input frequency spectrum and an interference portion of the input frequency spectrum and splitting the input signal between a first output that provides a first spectrum that is in phase with the input signal and a second output that provides a second spectrum that is 180 degrees out of phase from the input signal;
    a delay line for receiving the first output from the splitter;
    a tunable notch filter for receiving the second output from the splitter and filtering out the preferred portion of the input frequency spectrum and outputting only the interference portion, said tunable notch filter further comprising:
        a first wideband hybrid coupler with an input coupled to the second output of the splitter and first and second outputs;
        first and second band stop filters coupled to the first and second outputs of the first wideband hybrid coupler, each band stop filter having an output; and
        a second wideband hybrid coupler with inputs coupled to the outputs of the first and second band stop filters and an output; and
    a summer for combining the output of the second wideband hybrid coupler and the delay line such that the interference portion of the input frequency spectrum is cancelled out in the output signal of the summer.

2. The receiver of claim 1 wherein the first and second band stop filters further comprise varactors for tuning the notch filter to filter out the preferred portion of the input frequency spectrum.

3. The receiver of claim 2 wherein the first and second band stop filters further comprise bias voltage elements for changing an equivalent capacitance value of the varactor such that the center operation frequency of the notch filter is set.

4. The receiver of claim 1 wherein the first and second wideband hybrid couplers further comprise Lange couplers.

5. The receiver of claim 1, further comprising an input impedance coupled to an input of the first wideband hybrid coupler and an absorptive load at the output of the second wideband hybrid coupler.

6. The receiver of claim 5 wherein the input impedance and the absorptive load are 50 Ohms.

7. A receiver for performing notch cancellation on a wideband signal, said receiver comprising:
    a power splitter for receiving the wideband signal comprising a preferred portion of a frequency spectrum and an interference portion of the frequency spectrum and splitting the wideband signal between a first output that provides a first spectrum that is in phase with the wideband signal and a second output that provides a second spectrum that is 180 degrees out of phase from the wideband signal;
    a delay line for receiving the first spectrum from the first output of the power splitter;
    a tunable notch filter for receiving the second spectrum from the second output of the power splitter, said tunable notch filter filtering out the preferred portion of the input frequency spectrum and outputting only the interference portion; and
    a power summer for combining the output of the tunable notch filter and the output of the delay line such that the interference portion of the frequency spectrum is cancelled out in the output signal of the power summer.

8. The receiver of claim 7, wherein the notch filter further comprises:
    a first wideband hybrid coupler with an input coupled to the second output of the power splitter and two outputs;
    first and second band stop filters coupled to outputs of the first wideband hybrid coupler, each band stop filter having an output; and
    a second wideband hybrid coupler with inputs coupled to the outputs of the first and second band stop filters and an output coupled to the power summer.

9. The receiver of claim 8 wherein the first and second band stop filters further comprise varactors for tuning the notch filter to filter out a different preferred portion of the input frequency spectrum.

10. The receiver of claim 9 wherein the first and second band stop filters further comprise bias voltage elements for changing an equivalent capacitance value of the varactor such that the center operation frequency of the notch filter is set.

11. The receiver of claim 8 wherein the first and second wideband hybrid couplers further comprise Lange couplers.

12. The receiver of claim 8, further comprising:
    an input impedance coupled to an input of the first wideband hybrid coupler; and
    an absorptive load at the output of the second wideband hybrid coupler;

wherein the input impedance and the absorptive load are 50 Ohms.

13. A method for performing notch cancellation on a wideband signal comprising a preferred portion of a frequency spectrum and an interference portion of the frequency spectrum, said method comprising the steps of:
  splitting the wideband signal into a first spectrum that is in phase with the wideband signal and a second spectrum that is 180 degrees out of phase from the wideband signal;
  receiving the first spectrum at a delay line;
  receiving the second spectrum at a tunable notch filter, said tunable notch filter filtering out the preferred portion of the frequency spectrum of the second signal and outputting only the interference portion; and
  combining the output of the tunable notch filter and the output of the delay line such using a power summer so that the interference portion of the frequency spectrum is cancelled out in the output signal of the power summer.

14. The method of claim 13, further comprising the steps of:
  providing a first wideband hybrid coupler with an input coupled to the second output of the power splitter and two outputs;
  providing first and second band stop filters coupled to outputs of the first wideband hybrid coupler, each band stop filter having an output; and
  providing a second wideband hybrid coupler with inputs coupled to the outputs of the first and second band stop filters and an output coupled to the power summer.

15. The method of claim 14 wherein the first and second band stop filters further comprise varactors for tuning the notch filter to filter out a different preferred portion of the input frequency spectrum.

16. The receiver of claim 15 wherein the first and second band stop filters further comprise bias voltage elements for changing an equivalent capacitance value of the varactor such that the center operation frequency of the notch filter is set.

17. The method of claim 14 wherein the first and second wideband hybrid couplers further comprise Lange couplers.

18. The method of claim 14, further comprising the steps of:
  providing an input impedance coupled to an input of the first wideband hybrid coupler; and
  providing an absorptive load at the output of the second wideband hybrid coupler;
  wherein the input impedance and the absorptive load are 50 Ohms.

* * * * *